(12) United States Patent
Wang

(10) Patent No.: US 7,157,925 B2
(45) Date of Patent: Jan. 2, 2007

(54) TEST STRUCTURE FOR SPEEDING A STRESS-INDUCED VOIDING TEST AND METHOD OF USING SAME

(75) Inventor: Chien-Jung Wang, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 225 days.

(21) Appl. No.: 10/822,193

(22) Filed: Apr. 9, 2004

(65) Prior Publication Data
US 2005/0224792 A1    Oct. 13, 2005

(51) Int. Cl.
G01R 31/26 (2006.01)
H01L 23/58 (2006.01)

(52) U.S. Cl. ........................ 324/765; 257/48
(58) Field of Classification Search .................. None
See application file for complete search history.

(56) References Cited

U.S. PATENT DOCUMENTS

| 5,010,024 | A |  | 4/1991 | Allen et al. ............... 437/24 |
|---|---|---|---|---|
| 5,156,909 | A |  | 10/1992 | Henager, Jr. et al. ....... 428/334 |
| 5,504,017 | A |  | 4/1996 | Yue et al. ........................ 437/8 |
| 5,550,405 | A |  | 8/1996 | Cheung et al. ............. 257/642 |
| 5,838,161 | A | * | 11/1998 | Akram et al. ............... 324/755 |
| 5,963,784 | A | * | 10/1999 | Bothra et al. ................. 438/18 |
| 5,973,402 | A |  | 10/1999 | Shinriki et al. ............. 257/768 |
| 6,037,795 | A |  | 3/2000 | Filippi et al. ............... 324/763 |
| 6,087,189 | A | * | 7/2000 | Huang ........................ 438/10 |
| 6,144,040 | A | * | 11/2000 | Ashton ........................ 257/48 |
| 6,174,743 | B1 |  | 1/2001 | Pangrle et al. ................ 438/14 |
| 6,191,481 | B1 |  | 2/2001 | Bothra et al. ............... 257/734 |
| 6,221,794 | B1 |  | 4/2001 | Pangrle et al. ............. 438/792 |
| 6,362,638 | B1 | * | 3/2002 | Ashton et al. ............. 324/755 |

* cited by examiner

*Primary Examiner*—Paresh Patel
(74) *Attorney, Agent, or Firm*—Thomas, Kayden, Horstemeyer & Risley

(57) ABSTRACT

A test structure, having: a first member having: a roughly a rectangular shape; a first width dimension; and a first length dimension that is greater than the first width dimension; and a second member having: a roughly a rectangular shape; a second width dimension; and a second length dimension that is greater than the second width dimension combined with the first member to form a roughly symmetrical cross-shaped test structure. Also a method of using the test structure to test for voids.

32 Claims, 2 Drawing Sheets

TEST STRUCTURE FOR SPEEDING A STRESS-INDUCED VOIDING TEST AND METHOD OF USING SAME

FIELD OF THE INVENTION

The present invention relates generally to testing and diagnostics of line processes used for the manufacture of integrated circuit devices and more specifically to the detection and measurement of voids in copper interconnect metallurgy.

BACKGROUND OF THE INVENTION

The manufacture of large scale integrated circuits in a mass production facility involves hundreds of discrete processing steps beginning with the introduction of blank semiconductor wafers at one end and recovering the completed chips at the other end. The manufacturing process is usually conceived as consisting of the segment wherein the semiconductor devices are formed within the silicon surface (front-end-of-line) and the portion which includes the formation of the various layers of interconnection metallurgy above the silicon surface (back-end-of-line). Most of these processing steps involve depositing layers of material, patterning them by photolithographic techniques and etching away the unwanted portions. These materials consist primarily of insulators and metal alloys.

In order to monitor the integrated circuit manufacturing process, test structures that are representative of the circuit elements are typically incorporated into regions of the wafer outside of the integrated circuit chips as product failures are closely correlated to test structure/site failures.

Examples of these in-line test devices are: a dumb-bell structure testable with a four point probe to establish proper resistivity of a deposited layer; or long serpentine metal lines which can be tested to establish the presence of particulate defects by testing for electrical opens and shorts. These devices are typically designed with critical areas much larger than their corresponding elements in the integrated circuit so they are more sensitive to defects and can be tested at various stages during processing. In addition to such devices which characterize the cleanliness and integrity of the process line, test sites must also be provided which can characterize the integrity of pattern alignment and planar dimensions.

Of particular interest is this invention is the ability to detect the formation of voids in buried (copper) interconnect lines. These voids are typically created by mechanical stresses which cause delamination of the metal line from the adjacent insulative matrix. The resulting void, while not directly producing an open circuit in the metal line, is nevertheless responsible for creating a hot spot when a current is passed through the line. Such hot spots encourage electromigration in the copper which in turn causes migration of the void along the line, eventually combining with other voids to form a larger void at a point where the metal lines meet a contact or via. The result is an "open" failure. It would therefore be desirable to have a means of early detection of hidden stress induced voids in metal lines.

Traditional test structures use the copper (Cu) volume effect (where more volume causes more micro-vacancies produced after baking) to dominate the SIV failure only.

U.S. Pat. No. 6,037,795 to Filippi et al. describes a multiple device test layout.

U.S. Pat. No. 6,191,481 to Bothra et al. describes electromigration impeding composite metallization lines and methods for making the same.

U.S. Pat. No. 5,973,402 to Shinriki et al. describes a metal interconnection and a method for making the same.

U.S. Pat. No. 5,504,017 to Yue et al. describes void detection in metallization patterns.

U.S. Pat. No. 5,156,909 to Henager, Jr. et al. describes thick, low-stress films, and coated substrates formed therefrom, and methods for making same.

U.S. Pat. No. 5,010,024 to Allen et al. describes passivation for integrated circuit structures.

U.S. Pat. Nos. 6,174,743 B1 and 6,221,794 B1, both to Pangrie et al., describe a method of reducing incidence of stress-induced voiding in semiconductor interconnect lines.

SUMMARY OF THE INVENTION

Accordingly, it is an object of one or more embodiments of the present invention to provide a novel test structure for speeding the stress-induced voiding test.

Other objects will appear hereinafter.

It has now been discovered that the above and other objects of the present invention may be accomplished in the following manner. Specifically, a test structure, has: (1) a first member having: a roughly a rectangular shape; a first width dimension; and a first length dimension that is greater than the first width dimension; and (2) a second member having: a roughly a rectangular shape; a second width dimension; and a second length dimension that is greater than the second width dimension combined with the first member to form a roughly symmetrical cross-shaped test structure. Also a method of using the test structure to test for voids.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
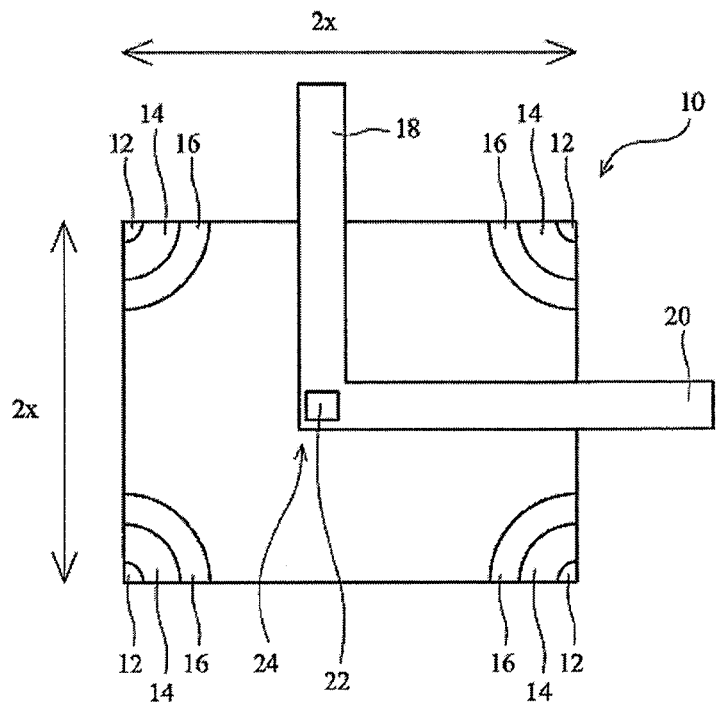
FIG. 1 is a top or bottom down plan view of a test structure known to the inventor showing stress contour simulation.

Structure Known to the Inventor—not to be Considered Prior Art—FIG. 1

FIG. 1 illustrates a structure known to the inventor and is not to be considered prior art for the purposes of this invention.

FIG. 1 illustrates a test structure 10 known to the inventor having a square shape with the dimensions 2X by 2X that utilizes the volume effect to dominate the Stress-Induced Voiding (SIV) failure only. Included in FIG. 1 is a stress contour simulation using finite elements analysis (FEA) showing stress gradients 12, 14, 16. Two metal lines 18, 20 intersect at about a 90° angle with a via 22 connecting their 18, 20 intersection with the approximate center 24 of the square-shaped test pattern 10.

Figure 2:
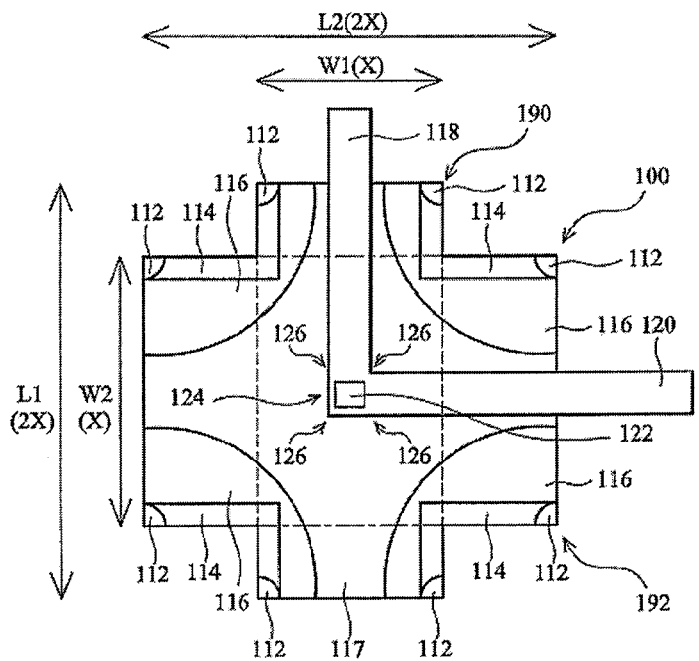
FIG. 2 is a top or bottom down plan view of the preferred embodiment test structure of the present invention showing stress contour simulation.

Test Structure of the Present Invention—FIG. 2

FIG. 2 illustrates the cross-shaped test structure 100 of the present invention for speeding a stress-induced voiding test.

The inventor has discovered that the cross-shaped test structure 100 of the present invention can not only evaluate the volume effect, but can also utilize geometry-enhanced stress effect into consideration and thus this cross-shaped test structure 100 allows more strict examination than the traditional test structure of FIG. 1 for SIV and provides for the speeded-up testing so that the time to failure is reduced as the baking time may be reduced from about 500 hours for FIG. 1 to about 168 hours for FIG. 2 (also see below).

The cross-shaped test structure 100 may be formed on a special test wafer or on a test site or kerf on a product wafer. If formed upon a test wafer, the cross-shaped test structure 100 may be from about 0.4×0.4 µm to about 100.0×100.0 µm.

The inventor has discovered that a test structure 100 having an area that is about 75% (¾) of the area of the square-shaped test structure 10 known to the inventor and having a specific geometry, i.e. cross-shaped as shown in FIG. 2, accelerates SIV failure (Stress-Induced Voiding failure). Cross-shaped test structure 100 has a thickness of preferably from about 5000 to 10,000 Å and more preferably about 5000 Å. The cross-shaped test structure 100 is embedded and exposed within a dielectric layer formed over the silicon wafer. In a preferred embodiment of the invention, the test structure 100 comprises a first member 190 having a roughly rectangular shape with a first width dimension W1 and a first length dimension L1 that is greater than the first width dimension W1, and a second member 192 having a roughly rectangular shape having a second width dimension W2 and a second length dimension L2 that is greater than the second width dimension W2. The second member 192 is combined with the first member 190 to form a roughly symmetrical cross-shaped test structure 100. Preferably, W1 is larger than (L2-W1)/2, W1 is larger than (L1-W2)/2, W2 is larger than (L2-W1)/2, and/ or W2 is larger than (L1-W2)/2.

Two metal lines 118, 120 intersect at about a 90° angle with a via 122 connecting their 118, 120 intersection with the approximate center 124 of the cross-shaped test pattern 100. Metal lines 118, 120 are formed within an inter-metal dielectric (IMD) layer formed over the dielectric layer with the via 122 extending from the cross-shaped test structure 100 to the metal line 118, 120 intersection. The via 122 having a cross-section of preferably from about $10^3$ to $10^4$ Å$^2$.

Simply, the test structure 100, metal lines 118, 120 and via 122 are formed in the same way as is the product metallization, that is:

forming a dielectric layer over the silicon substrate/wafer/
forming a cross-shaped damascene opening within the dielectric layer;
filling the damascene opening with a first copper layer;
planarizing, preferably by chemical mechanical polishing (CMP), the copper layer to form the cross-shaped test structure 100;
forming an IMD layer over the planarized copper cross-shaped test structure 100 and the dielectric layer;
forming a dual damascene opening within the IMD layer with the lower via opening exposing a portion of the planarized cross-shaped test structure 100 approximate its center 124;
filling the dual damascene opening with a second copper layer; and
planarizing, preferably by chemical mechanical polishing (CMP), the second copper layer to form the via 122 and metal lines 118, 120.

Metal lines 118, 120 have a thickness of preferably from about 5000 to 10,000 Å and more preferably about 5000 Å. Via 122 has a length from the cross-shaped test structure 100 to the metal line 118, 120 intersection of preferably from about 5000 to 10,000 Å and more preferably about 5000 Å.

Figure 3:
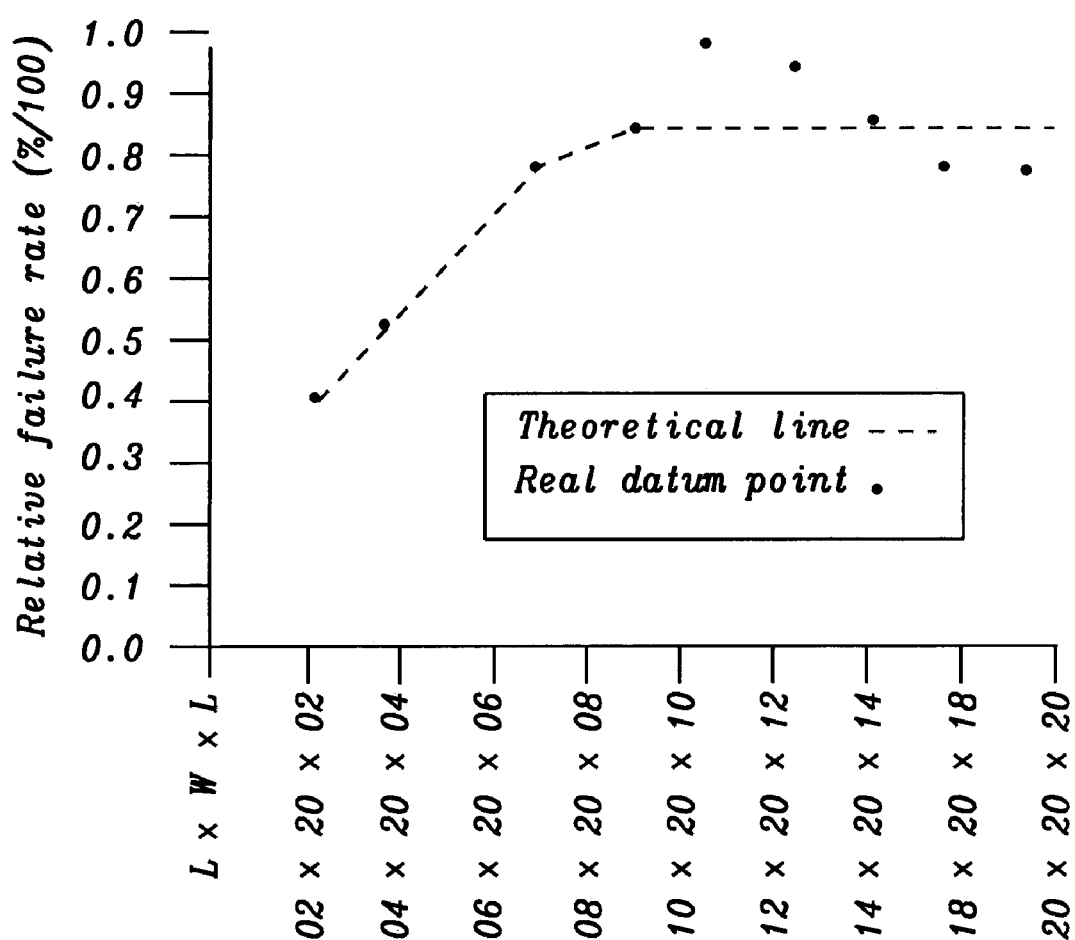
FIG. 3 is a graph showing relative failure rate by length/width/length.

Graph of Relative Failure Rate by Length/Width/Length—FIG. 3

As shown in the graph of FIG. 3, the inventor has discovered that a maximum failure rate exits for a length (L)×width (W)×length (L) of 10×20×10, i.e. a rectangular dimension of X by 2X, using actual datum points despite the theoretical failure rate shown by the dashed line of FIG. 3.

Thus, the inventor combined two maximum failure X by 2X rectangular structures to form the maximum failure cross-shaped test structure 10 of the present invention shown in FIG. 2 having a total area that is about 75% (¾) of the square-shaped test structure 10 known to the inventor and shown in FIG. 1.

Stress Contour Simulation Using FEA—FIG. 2

Also shown in FIG. 2, is a stress contour simulation using finite elements analysis (FEA) showing stress gradients 112, 114, 116, 117 exerting stresses 126 upon the approximate center 124 of the cross-shaped test structure 100 of the present invention proximate the connection to the via 122. Thus, the geometry-enhanced stress effect of the cross-shaped test structure 100 is also taken into consideration permitting a more strict examination of voiding.

The cross-shaped test structure 100 is thus enhances a maximum stress gradient (X by 2X).

These FEA simulations of FIGS. 1 and 2 are strictly derived from a theoretical model of the test site using parameters such as thermal expansion coefficients and the thicknesses of the layers involved and use "Von Mises" stresses (equivalent stress).

Testing Procedure Utilizing the Cross-Shaped Test Structure 100

The resistance of the cross-shaped test structure 100, lines 118, 120 and via 122 is measured and then the entire structure 100, 118, 120, 122 is baked at from about 150 to 200° C. for preferably from about greater than about 0 to 168 hours and more preferably about 168 hours and the resistance is again measured. Any voids formed in the cross-shaped test structure 100 are detected by the differences in the initial and post-baked resistance. Due to the geometry (that is cross-shaped)-enhanced stress effect as discussed above and illustrated by the stress contours in FIG. 2, the baking time can thus be dramatically reduced from about 500 hours needed for the structure of FIG. 1 known to the inventor to establish if any product failure occurred; to preferably from about 150 to 186 hours and more preferably about 168 hours for the cross-shaped test structure 100 of the present invention to establish if any product failure occurred.

While the written description of the present invention notes that the cross-shaped test structure 100, lines 118, 120 and via 124 are each more preferably comprised of copper (Cu).

Advantages of the Present Invention

The advantages of one or more embodiments of the present invention include:

1. a test structure permitting quicker testing for voids; and
2. reducing the baking time in the voiding test.

While particular embodiments of the present invention have been illustrated and described, it is not intended to limit the invention, except as defined by the following claims.

I claim:

1. A test structure, comprising: a first member having: a roughly rectangular shape; a first width dimension; and a first length dimension that is greater than the first width dimension; and a second member having: a roughly rectangular shape; a second width dimension; and a second length dimension that is greater than the second width dimension; the second member being combined with the first member to form a roughly symmetrical cross-shaped test structure; and
   a first and second metal lines each having opposing ends; the first and second metal lines being joined at two of their respective opposing ends to form an intersection; and a via extending from the first and second metal line intersection to the approximate center of the cross-shaped test structure.

2. The structure of claim 1, wherein: the first length dimension of the first member is about twice as great as the first width dimension of the first member; and the second length dimension of the second member is about twice as great as the second width dimension of the second member.

3. The structure of claim 1, wherein the cross-shaped test structure is comprised of copper.

4. The structure of claim 1, wherein the cross-shaped test structure has a thickness of from about 5000 to 10,000 Å.

5. The structure of claim 1, wherein the cross-shaped test structure 100 has a thickness of about 5000 Å.

6. The structure of claim 1, wherein the cross-shaped test structure is formed on a test wafer or a test site within a product wafer.

7. The structure of claim 1, wherein the cross-shaped test structure is formed on a test wafer and the cross-shaped test structure occupies an area of from about 0.4 by 0.4 .mu.m on the test wafer.

8. The structure of claim 1, wherein the cross-shaped test structure is formed on a test wafer and the cross-shaped test structure occupies an area of from about 1.0 by 1.0 .mu.m on the test wafer.

9. The structure of claim 1, wherein the first and second metal lines being joined at two of their respective opposing ends at about a 90° to form the intersection.

10. The structure of claim 1, further including: a first and second metal lines each having opposing ends; the first and second metal lines being joined at two of their respective opposing ends at about a 90° to form an intersection; the first and second metal lines each having a thickness of from about 5000 to 10,000 Å; and a via extending from the first and second metal line intersection to the approximate center of the cross-shaped test structure; the via having a length of from about 5000 to 10,000 Å.

11. The structure of claim 1, further including: a first and second copper lines each having opposing ends; the first and second copper lines being joined at two of their respective opposing ends at about a 90° to form an intersection; the first and second copper lines each having a thickness of about 5000 Å; and a copper via extending from the first and second copper line intersection to the approximate center of the cross-shaped test structure; the copper via having a length of from about 5000 Å.

12. The structure of claim 1, wherein the cross-shaped test structure includes a center and stress gradients surrounding the center.

13. The structure of claim 1, wherein the cross-shaped test structure includes a center and stress gradients exerting maximum stress upon the center.

14. The structure of claim 1, wherein the test structure is formed within a dielectric layer.

15. A test structure, having: a first rectangular member having a first width dimension; and a first length dimension that is about twice as great as the first width dimension; and a second rectangular member having a second width dimension and a second length dimension that is about twice as great as the second width dimension; combined with the first rectangular member to form a symmetrical cross-shaped test structures; and
   a first and second metal lines each having opposing ends; the first and second metal lines being joined at two of their respective opposing ends to form an intersection; and a via extending from the first and second metal line intersection to the approximate center of the cross-shaped test structure.

16. The structure of claim 15, wherein the cross-shaped test structure is comprised of copper.

17. The structure of claim 15, wherein the cross-shaped test structure has a thickness of from about 5000 to 10,000 Å.

18. The structure of claim 15, wherein the cross-shaped test structure 100 has a thickness of about 5000 Å.

19. The structure of claim 15, wherein the cross-shaped test structure is formed on a test wafer or a test site within a product wafer.

20. The structure of claim 15, wherein the cross-shaped test structure is formed on a test wafer and the cross-shaped test structure occupies an area of from about 0.4 by 0.4 .mu.m on the test wafer.

21. The structure of claim 15, wherein the cross-shaped test structure is formed on a test wafer and the cross-shaped test structure occupies an area of from about 1.0 by 1.0 .mu.m on the test wafer.

22. The structure of claim 15, wherein the first and second metal lines being joined at two of their respective opposing ends at about a 90° to form the intersection.

23. The structure of claim 15, further including: a first and second metal lines each having opposing ends; the first and second metal lines being joined at two of their respective opposing ends at about a 90° to form an intersection; the first and second metal lines each having a thickness of from about 5000 to 10,000 Å; and a via extending from the first and second metal line intersection to the approximate center of the cross-shaped test structure; the via having a length of from about 5000 to 10,000 Å.

24. The structure of claim 15, further including: a first and second copper lines each having opposing ends; the first and second copper lines being joined at two of their respective opposing ends at about a 90° to form an intersection; the first and second copper lines each having a thickness of about 5000 Å; and a copper via extending from the first and second copper line intersection to the approximate center of the cross-shaped test structure; the copper via having a length of from about 5000 Å.

25. The structure of claim 15, wherein the cross-shaped test structure includes a center and stress gradients surrounding the center.

26. The structure of claim 15, wherein the cross-shaped test structure includes a center and stress gradients exerting maximum stress upon the center.

27. The structure of claim 15, wherein the test structure is formed within a dielectric layer.

28. A method of testing for voids utilizing a test structure as claimed in claim 1, wherein the method comprises:
   providing the test structure;
   providing a roughly right-angle metal line structure connected to the test structure by a via;
   testing the resistance of the test structure, right-angle metal line structure and via a first time;
   baking the test structure, right-angle metal line structure and via; and
   testing the resistance of the test structure, right-angle metal line structure and via a second time and comparing the first resistance test to the second resistance test.

29. The method of claim 28, wherein the roughly cross-shaped test structure, right-angle metal line structure and via are baked at a temperature of from about 150 to 200° C. for from greater than about 0 to 168 hours.

30. The method of claim 28, wherein the roughly cross-shaped test structure, right-angle metal line structure and via are baked at a temperature of from about 150 to 200° C. for about 168 hours.

31. A method of testing for voids utilizing a test structure as claimed in claim 15, wherein the method comprises:
   providing the test structure;
   providing a roughly right-angle metal line structure connected to the test structure by a via;
   testing the resistance of the test structure, right-angle metal line structure and via a first time;
   baking the test structure, right-angle metal line structure and via at a temperature of from about 150 to 200° C. for from greater than about 0 to 168 hours; and
   testing the resistance of the test structure, right-angle metal line structure and via a second time and comparing the first resistance test to the second resistance test.

32. The method of claim 31, wherein the roughly cross-shaped test structure, right-angle metal line structure and via are baked at a temperature of from about 150 to 200° C. for about 168 hours.

* * * * *